(12) United States Patent
Grabbe et al.

(10) Patent No.: US 6,709,981 B2
(45) Date of Patent: Mar. 23, 2004

(54) METHOD AND APPARATUS FOR PROCESSING A SEMICONDUCTOR WAFER USING NOVEL FINAL POLISHING METHOD

(75) Inventors: Alexis Grabbe, St. Charles, MO (US); Mick Bjelopavlic, O'Fallon, MO (US); Ashley S. Hull, St. Charles, MO (US); Michele L. Haler, St. Paul, MO (US); Guoqiang (David) Zhang, Ballwin, MO (US); Henry F. Erk, St. Louis, MO (US); Yun-Biao Xin, Glastonbury, CT (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/928,559

(22) Filed: Aug. 13, 2001

(65) Prior Publication Data

US 2002/0052064 A1 May 2, 2002

Related U.S. Application Data

(60) Provisional application No. 60/225,810, filed on Aug. 16, 2000.

(51) Int. Cl.⁷ .............................................. H01L 21/461
(52) U.S. Cl. ..................... 438/692; 438/693; 438/928; 438/959
(58) Field of Search .................. 438/690, 691, 438/692, 693, 928, 959

(56) References Cited

U.S. PATENT DOCUMENTS

| | | | |
|---|---|---|---|
| 3,691,694 A | | 9/1972 | Goetz et al. |
| 4,973,563 A | | 11/1990 | Prigge et al. |
| 5,110,428 A | | 5/1992 | Prigge et al. |
| 5,205,077 A | | 4/1993 | Wittstock |
| 5,389,579 A | * | 2/1995 | Wells .......................... 438/690 |

(List continued on next page.)

FOREIGN PATENT DOCUMENTS

| | | |
|---|---|---|
| DE | 198 36 831 A1 | 2/2000 |
| DE | 100 04 578 C1 | 8/2001 |
| EP | 0 787 562 A1 | 8/1997 |
| EP | 0 849 039 A2 | 6/1998 |
| EP | 0 990 485 A2 | 4/2000 |
| JP | 02-222144 | 9/1990 |
| JP | 2000-077373 | 3/2000 |
| JP | 2001 68435 | 3/2001 |
| WO | WO 99/09588 | 2/1999 |

OTHER PUBLICATIONS

International Search Report for International Application No. PCT/US01/25584 from the European Patent Office mailed Dec. 9, 2002.

Akamatsu, K., et al., Double Side Polishing for VLSI of Silicon Wafer—One Side Mirror Polishing Considered with Etched Wafer Roughness, Journal of the Japan Society for Precision Engineering, Jul. 1993, pp. 1163–1168, vol. 59, Issue 7, Japan.

*Primary Examiner*—Carl Whitehead, Jr.
*Assistant Examiner*—Stephen W. Smoot
(74) *Attorney, Agent, or Firm*—Senniger, Powers, Leavitt & Roedel

(57) ABSTRACT

A method of manufacturing a semiconductor wafer includes providing an ingot of semiconductor material, slicing the wafer from the ingot, and processing the wafer to increase parallelism of the front surface and the back surface. A final polishing operation on at least the front surface is performed by positioning the wafer between a first pad and a second pad and obtaining motion of the front and back surfaces of the wafer relative to the first and second pads to maintain parallelism of the front and back surfaces and to produce a finish on at least the front surface of the wafer so that the front surface is prepared for integrated circuit fabrication. In another aspect, the wafer is rinsed by a rinsing fluid to increase hydrodynamic lubrication. Other methods are directed to conditioning the polishing pad and to handling wafers after polishing. An apparatus for polishing wafers is also included.

48 Claims, 7 Drawing Sheets

U.S. PATENT DOCUMENTS

| | | | |
|---|---|---|---|
| 5,422,316 A | | 6/1995 | Desai et al. |
| 5,424,224 A | | 6/1995 | Allen et al. |
| 5,489,233 A | * | 2/1996 | Cook et al. .................... 451/41 |
| 5,643,405 A | | 7/1997 | Bello et al. |
| 5,656,097 A | | 8/1997 | Olesen et al. |
| 5,697,832 A | | 12/1997 | Greenlaw et al. |
| 5,704,987 A | | 1/1998 | Huynh et al. |
| 5,747,364 A | * | 5/1998 | Akiyama et al. ............. 438/14 |
| 5,800,725 A | | 9/1998 | Kato et al. |
| 5,827,779 A | | 10/1998 | Masumura et al. |
| 5,851,924 A | | 12/1998 | Nakazawa et al. |
| 5,860,848 A | | 1/1999 | Loncki et al. |
| 5,882,245 A | | 3/1999 | Popovich et al. |
| 5,899,743 A | | 5/1999 | Kai et al. |
| 5,942,445 A | | 8/1999 | Kato et al. |
| 5,957,757 A | | 9/1999 | Berman |
| 5,963,821 A | | 10/1999 | Kai et al. |
| 6,030,280 A | | 2/2000 | Fruitman |
| 6,043,156 A | | 3/2000 | Kai et al. |
| 6,051,498 A | * | 4/2000 | Pietsch et al. .............. 438/691 |
| 6,066,565 A | | 5/2000 | Kuroki et al. |
| 6,080,673 A | | 6/2000 | Ko et al. |
| 6,114,245 A | * | 9/2000 | Vandamme et al. ........ 438/690 |
| 6,325,698 B1 | | 12/2001 | Wada et al. |
| 6,458,688 B1 | | 10/2002 | Wenski et al. |
| 2001/0047978 A1 | | 12/2001 | Wenski et al. |

* cited by examiner

| Setting | $n_1$ | $n_2$ | $n_3$ | $n_4$ | $N_c$ | $N_p$ | $\sim V_{top}$ (cm/sec) | $\sim V_{bottom}$ (cm/sec) |
|---|---|---|---|---|---|---|---|---|
| 1 | 12.1 | -24.4 | 24 | 3 | 7.5 | -4.8 | 24.5+12.2cos(0.5t) | 160+35cos(0.5t) |
| 2 | 7.3 | -29.1 | 13 | 0 | 7.5 | -4.8 | 24.1+12.2cos(0.5t) | 160+35cos(0.5t) |
| 3 | 8.5 | -29.1 | 13 | 0 | 7.5 | -4.8 | 30.1+13.7cos(0.5t) | 160+35cos(0.5t) |
| 4 | 9.4 | -29.1 | 13 | 0 | 7.5 | -4.8 | 34.6+14.9cos(0.5t) | 160+35cos(0.5t) |
| 5 | 10.4 | -29.1 | 13 | 0 | 7.5 | -4.8 | 39.6+16.2cos(0.5t) | 160+35cos(0.5t) |
| 6 | 11.4 | -29.1 | 13 | 0 | 7.5 | -4.8 | 44.6+17.5cos(0.5t) | 160+35cos(0.5t) |

Fig. 4

| Step | Time sec. | Slurry solids | $H_2O_2$ moles/liter | $H_3PO_4$ moles/liter | KOH moles/liter | PEO grams/liter | $NH_4OH$ moles/liter | IPA moles/liter | Debye length angstroms | ionic strength millimolar | $H_o$ front | $H_o$ back |
|---|---|---|---|---|---|---|---|---|---|---|---|---|
| 1 | 18 | 0.045 | | | 1.6E-01 | | | | 7.8 | 1.6E-01 | >1.0 | >0.35 |
| 2 | 24 | 0.045 | | | 8.0E-02 | | 5.8E-03 | | 11 | 8.0E-02 | 2.0 | 0.39 |
| 3 | 480 | 0.045 | | | 5.0E-02 | | 5.8E-03 | | 14 | 5.0E-02 | 1.0 | 0.15 |
| 4 | 210 | 0.045 | | | 5.0E-03 | | 5.8E-03 | | 43 | 5.3E-03 | 1.1 | 0.17 |
| 5 | 60 | 0.045 | | | | | 5.8E-03 | | 180 | 3.0E-04 | 1.1 | 0.17 |
| 6 | 6 | 0.045 | | 6.8E-04 | | 0.51 | 3.0E-02 | 6.7E-02 | 75 | ~3.4E-03 | 83 | 12 |
| 7 | 18 | | | 6.8E-04 | | 0.51 | 3.0E-02 | 6.7E-02 | 75 | ~3.4E-03 | 83 | 12 |
| 8 | 24 | | 0.10 | 7.9E-04 | | 0.51 | 1.1E-02 | 6.7E-02 | 75 | ~3.4E-03 | 83 | 12 |

Fig. 5A

| Step | pH | Flow rate ml/min | Pressure kPa | n1 upper pad rpm | n2 lower pad rpm | n3 inner ring rpm | n4 outer ring rpm | average lower velocity cm/s | average upper velocity cm/s |
|---|---|---|---|---|---|---|---|---|---|
| 1 | 13.2 | 1200 | ramp up | 6.0 | -8.0 | 8.0 | 1.0 | 54 | 19 |
| 2 | 12.9 | 2400 | 3.2 | 9.0 | -16.0 | 16.0 | 2.0 | 104 | 21 |
| 3 | 12.7 | 2000 | 9.7 | 7.3 | -29.1 | 13.0 | 0.0 | 160 | 24 |
| 4 | 11.7 | 2400 | 8.6 | 7.3 | -29.1 | 13.0 | 0.0 | 160 | 24 |
| 5 | 10.5 | 2400 | 8.6 | 7.3 | -29.1 | 13.0 | 0.0 | 160 | 24 |
| 6 | 10.5 | 3000 | 0.75 | 7.3 | -29.1 | 13.0 | 0.0 | 160 | 24 |
| 7 | 10.5 | 3000 | 0.75 | 7.3 | -29.1 | 13.0 | 0.0 | 160 | 24 |
| 8 | 10.0 | 3000 | 0.75 | 7.3 | -29.1 | 13.0 | 0.0 | 160 | 24 |

Fig. 5B

METHOD AND APPARATUS FOR PROCESSING A SEMICONDUCTOR WAFER USING NOVEL FINAL POLISHING METHOD

CROSS-REFERENCE TO RELATED APPLICATION

This application claims priority from U.S. Patent application Ser. No. 60/225,810 (provisional), filed Aug. 16, 2000, which is hereby incorporated by reference.

BACKGROUND OF THE INVENTION

The present invention relates generally to methods of processing semiconductor wafers, and more particularly to a method of processing a semiconductor wafer including final polishing a front surface of the semiconductor wafer.

Semiconductor wafers are generally prepared from a single crystal ingot, such as a silicon ingot, that is trimmed and is usually ground to have a notch or flat for orienting the wafer in subsequent procedures. The ingot is sliced into individual wafers which are each subjected to a number of processing operations to remove damage caused by the slicing operation and to ensure that the wafer surfaces are flat.

During processing, the surfaces of each wafer are usually polished to remove damage to the front and back surfaces induced by prior operations. Simultaneous double surface polishing (DSP) has become preferred in the industry because such polishing yields a wafer with flatter, more parallel surfaces. Unfortunately, conventional DSP technology cannot produce a wafer having a front surface prepared for integrated circuit fabrication. For example, conventional DSP technology produces wafers having front surfaces which are not sufficiently smooth and have significantly more haze than is acceptable for integrated circuit fabrication. Therefore, the front surface of the wafer is final polished in a single surface polishing operation to improve the smoothness and to reduce the scratches and haze in the front surface caused by the DSP operation such that the front surface is prepared for integrated circuit fabrication. However, single surface processing operations generally degrade the wafer flatness, including site flatness, and degrade parallelism (flatness and parallelism may generally be described as topology) which has been previously achieved by the simultaneous double surface polishing operation. Topological degradation may be caused by a non-uniform backing film such as wax used to mount the wafer which results in non-uniform material removal. The backing film serves as the reference plane for polishing the front surface, and imperfections therein can degrade flatness and parallelism. For example and referring to FIG. 6A, a wafer W having substantially flat, parallel surfaces is mounted on imperfect wax layer L of a plate P. The wafer elastically deforms as shown in FIG. 6B and is polished flat as shown in FIG. 6C. Upon removing the wafer from the wax (FIG. 6D), the wafer returns to a "free state" in which the imperfections in the wax layer are seen in the front surface (the upper surface in FIG. 6D).

Similarly, in another type of final polishing process (sometimes referred to as CMP or free-mount CMP) wherein the wafer is mounted in a retaining ring and is substantially fixed against a backing membrane, pad or template by friction and surface tension, topological degradation may be caused by irregularities and deviations in the backing membrane, pad or template. Note that in such a CMP operation, movement of the wafer W relative to the backing pad or template is not desirable because such movement may cause undesirable damage to the back surface and may cause the release of scratch-causing or damaging particles which can migrate to the interface between the wafer and a polishing pad.

SUMMARY OF THE INVENTION

Among the several objects of the present invention may be noted the provision of a method of processing a semiconductor wafer which produces a relatively flat wafer; the provision of such a method which produces a wafer having parallel surfaces; the provision of such a method which improves the yield of polished wafers; and the provision of such a method which produces a finished front surface prepared for integrated circuit fabrication.

Further among the several objects of the invention is the provision of a method of handling wafers after batch processing which inhibits damage to the wafer and which improves the yield of polished wafers.

Also among the several objects of the invention is the provision of an apparatus for polishing semiconductor wafers which reduces contamination of polishing slurry used in the apparatus and which reduces haziness of wafers polished in the apparatus.

Briefly, a method of the invention is directed to manufacturing a semiconductor wafer having a front surface and a back surface. The method comprises the operations of providing an ingot of semiconductor material, slicing the wafer from the ingot, and processing the wafer to increase parallelism of the front surface and the back surface. A further operation of final polishing the front surface is performed by positioning the wafer between a first pad and a second pad and obtaining motion of the front and back surfaces of the wafer relative to the first and second pads to maintain parallelism of the front and back surfaces and to produce a finish on at least the front surface of the wafer so that the front surface is prepared for integrated circuit fabrication.

Another method includes final polishing the front surface by providing a polishing apparatus having a wafer carrier generally disposed between a first pad and a second pad. The second pad has surface area for contacting the back surface of the wafer which is at least about 10 percent larger than the back surface of the wafer. The wafer is placed in the wafer carrier so that the front surface faces the first pad and so that the back surface faces the second pad. The wafer is free to move relative to the first and second pads. A solution including polishing slurry is applied between the pads and rotation speeds of the wafer carrier, the first pad and the second pad are selected such that during rotation velocity of the back surface relative to the second pad is less than velocity of the front surface relative to the first pad to inhibit unstable hydrodynamic lubrication between the second pad and the back surface and inhibit vibration of the wafer. At least one of the wafer carrier, the first pad and the second pad is rotated such that the front and back surfaces of the wafer rotate and translate relative to the first and second pads.

In yet another method, a polishing slurry is applied to the pad and at least one of the wafer and pad is rotated to polish at least one of the surfaces of the wafer. The wafer is rinsed by applying a rinsing fluid to the pad after polishing to increase hydrodynamic lubrication between the wafer and pad and to maintain a solution including the slurry and the rinsing fluid at a buffered pH of between about 7.8 and about 11.8 such that the solution in contact with the wafer is alkaline and such that silica agglomeration is inhibited.

In another method, the wafer is placed in position for polishing by a pad and the pad is conditioned by applying a solution including polishing slurry containing silica particles and an alkaline component to the pad. At least one of the wafer and pad is rotated and pressure is applied to the wafer to polish at least one of the surfaces of the wafer.

In a method of handling semiconductor wafers after batch processing the wafers in a batch processing machine, the method comprises removing each wafer from the batch processing machine and spraying a first solution onto a front surface of each wafer which adsorbs to the front surface and inhibits particle adhesion to the front surface.

An apparatus of the invention for polishing semiconductor wafers comprises upper and lower platens adapted to rotate and to mount upper and lower pads, respectively. The lower pad is adapted to mount a wafer carrier thereon. The apparatus further comprises means for applying a solution to the pads and wafer carrier drive components for rotating the wafer carrier. The solution contacts exposed portions of the drive components during polishing, and the drive components exposed to contact by the solution have no composite reinforcing particles therein so that particle contamination of the solution and the wafers is inhibited.

Other objects and features of the present invention will be in part apparent and in part pointed out hereinafter.

BRIEF DESCRIPTION OF THE DRAWINGS

FIG. 4 is a table showing suitable rotation speed settings for the polishing apparatus;

FIGS. 5A and 5B are tables of parameters used in an example final polishing process of this invention.

Corresponding reference characters indicate corresponding parts throughout the several views of the drawings.

DETAILED DESCRIPTION OF THE PREFERRED EMBODIMENT

Figure 1:
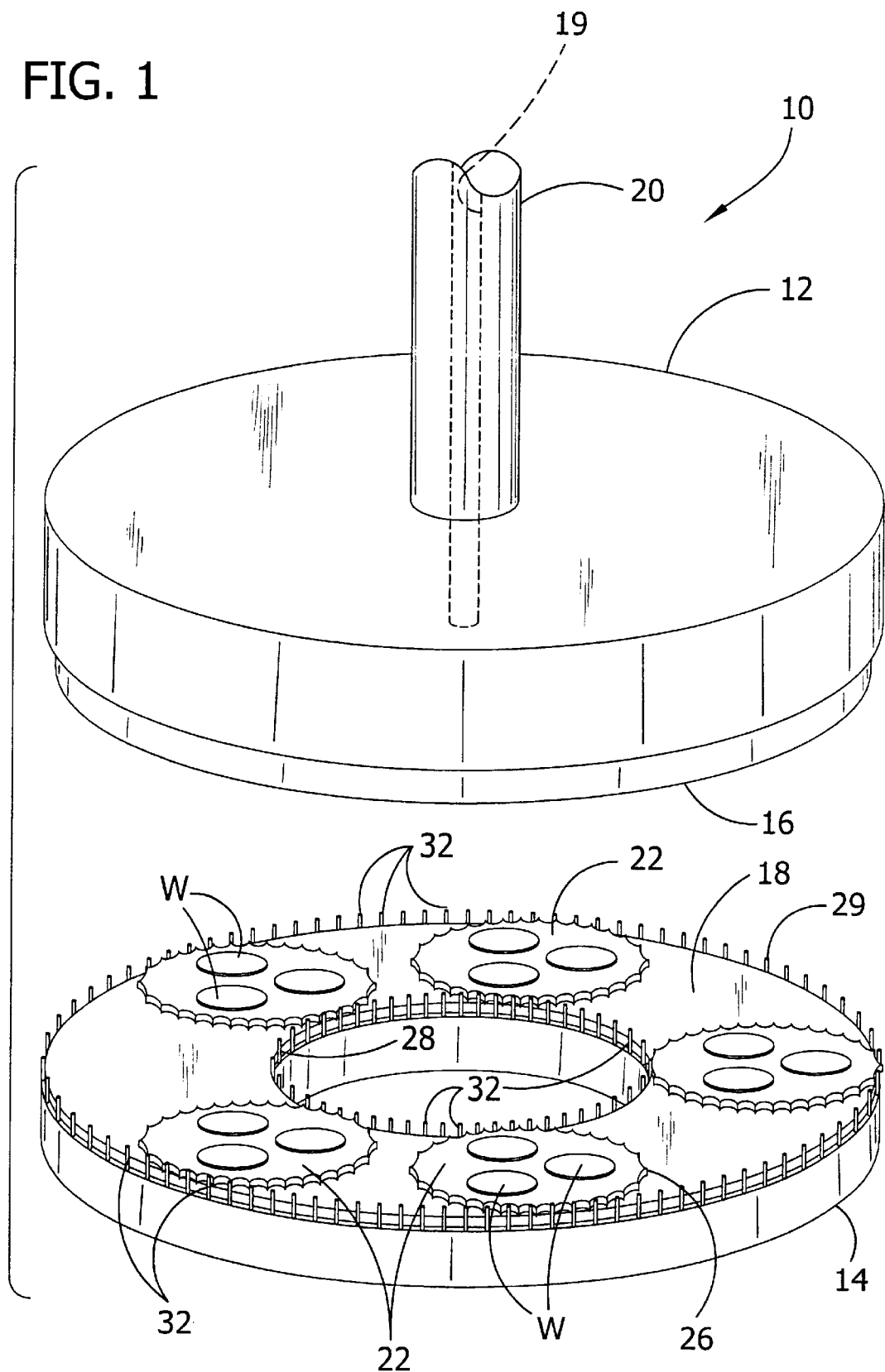
FIG. 1 is a schematic perspective view of a double surface polishing apparatus used in a method of this invention.
Figure 2:
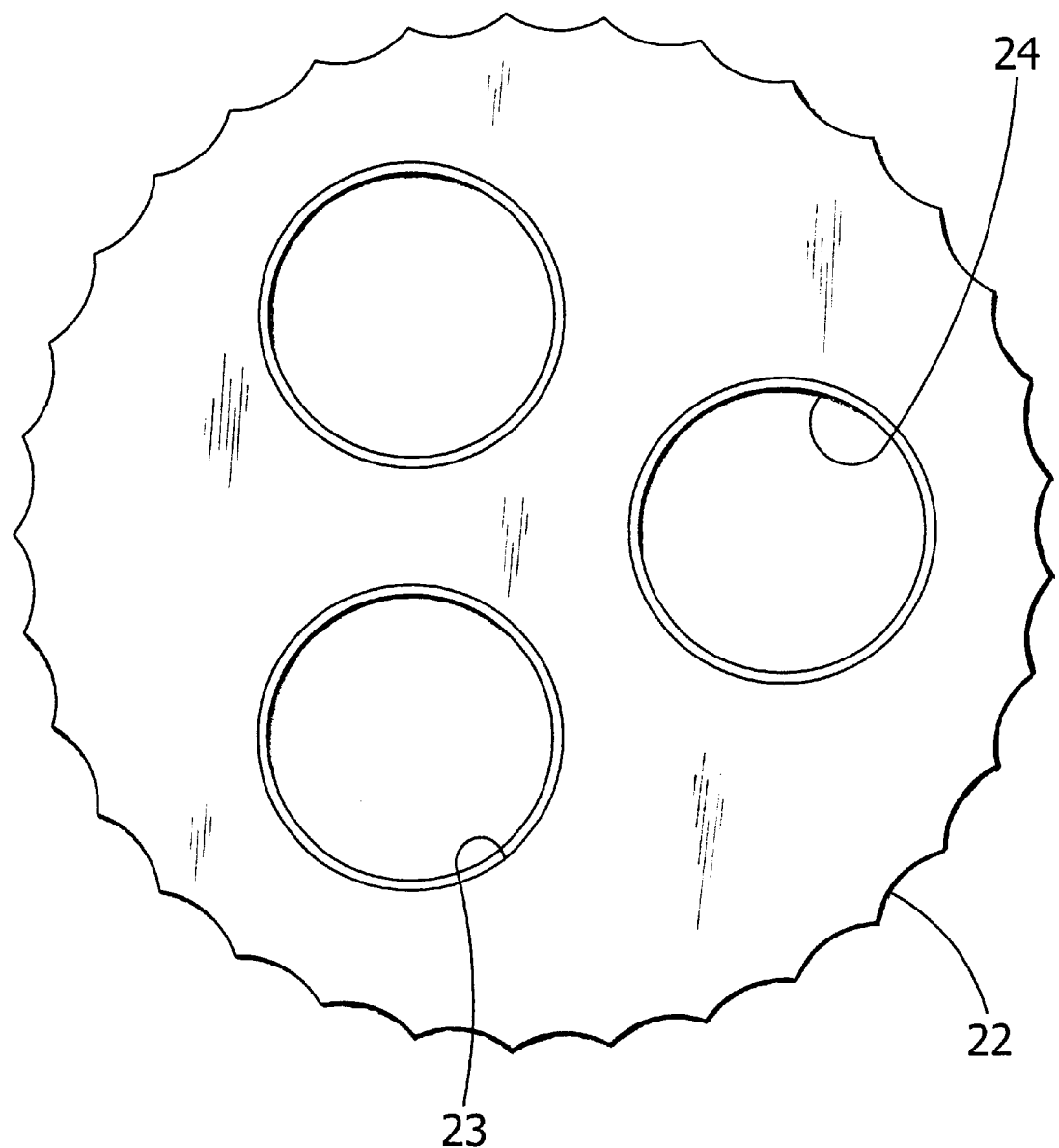
FIG. 2 is a top view of a wafer carrier with the wafers omitted.

Referring now to the drawings and in particular to FIGS. 1 and 2, a portion of a double surface polishing apparatus, such as a Model AC1400 made by Peter Wolters Gmbh, Rendsburg, Germany, is shown schematically and generally referred to as 10. Preferably, the double surface polisher is adapted to simultaneously final polish front surfaces of multiple semiconductor wafers W sliced from one or more monocrystalline ingots (e.g., a silicon ingot). As will be seen, the polisher is adapted to simultaneously polish both surfaces of each wafer W, but it is contemplated that only the front surface of the wafer be polished in the method of this invention. An important aspect of the invention is that a back surface (the surface facing upward in FIG. 1) of the wafer W be freely movable (i.e., in rotation and translation) relative to an upper pad of the apparatus so that deviations and imperfections in the back pad do not substantially affect the front surface and do not degrade the parallelism of the surfaces. It is of less importance that the back surface be polished during the final polishing operation. Other types of polishing apparatus are contemplated, including apparatus which are not adapted to batch process multiple wafers. Note that in contrast to the present invention, in a conventional free-mount CMP operation, movement of the wafer W relative to the backing pad or template typically causes undesirable particles and damage. Yet fixing the wafer causes undesirable deformation as shown in FIGS. 6A–D, and thus, such an operation is distinguishable in at least this respect from the final polishing operation of this invention.

In this embodiment, the polishing apparatus 10 includes a generally circular upper platen 12 and a generally circular lower platen 14. Upper pad 16 is mounted on the downwardly facing surface of the upper platen 12 for polishing the back surface of each wafer W and a lower polishing pad 18 is mounted on the upwardly facing surface of the lower platen 14 for final polishing the front surface of the wafer. It is contemplated that the upper pad 16 be adapted to avoid removing little or no material from the back surface such that the back surface is minimally polished. Mixtures of, for example polishing slurry, de-ionized water (DI), alkaline components and rinsing fluid (generally referred to herein as "solution") are applied to the pads by suitable means. In the illustrated embodiment, solution is applied to the pads by tubes 19 (only one is shown for clarity) which may suitably extend through a shaft 20 of the upper platen 12 to deliver the solution to the upper pad 16. The upper pad typically includes holes to allow the solution to flow through the upper pad and downward to the wafer W and to the lower pad 18. Other ways of applying solution to the pads may be used, including spraying the solution into the space between the pads, or introducing solution through the lower platen directly to the lower pad 18.

The upper platen 12 and lower platen 14 of the double surface polishing apparatus are adapted to rotate at a selected rotation speed by suitable drive mechanisms (not shown), as is known in the art and from, for example, U.S. Pat. Nos. 5,205,077 and 5,697,832, which are incorporated herein by reference. A plurality of circular wafer carriers 22 (five are shown in this embodiment) rest on the lower polishing pad 18. Each wafer carrier 22 has at least one circular opening 23 (three openings in this embodiment) adapted to receive a wafer W for polishing at least the front surface of the wafer. An insert 24 (see FIG. 2) is mounted in the opening and is interposed between the metal (typically steel) body of the wafer carrier and the wafer W to inhibit metal-to-wafer contact and thereby inhibit damage to the wafer. Preferably, the insert 24 is made of a relatively soft, relatively pure material, such as polyvinylidene fluoride (PVDF), nylon or polyacetal, and does not contain composite reinforcing particles such as fiberglass. Moreover, the insert 24 is preferably made of a material which is non-marring and cannot be abraded (or at least resists abrasion) or otherwise damaged such that harmful scratch-causing particles in the insert could potentially be released into the solution contacting the wafer W. The aforementioned materials (PVDF, nylon, polyacetal) reduce harmful scratch-causing particles which are typically generated during DSP. Such scratch-causing particles circulate in the solution contacting the wafer W and may scratch the surface of the wafer, as when the solution is forced against the wafer by one of the pads. Generally, reducing scratch-causing particles in the fluids surrounding the wafer W reduces the scratches and haze in the wafer surfaces caused by DSP. In this embodiment, the periphery of each wafer carrier 22 has gearing 26 engaged by a "sun" or inner gear 28 and an outer ring gear 29 of the apparatus 10. The inner and outer gears are driven by suitable drive mechanisms (not shown) to rotate the carrier 22 at a selected speed. The gears and drive mechanisms are generally described as wafer carrier drive components, and it is contemplated that the drive components may be other than gears, e.g., wheels which frictionally engage edges of the wafers to rotate the wafers. The inner and outer gears of this embodiment are constituted by a plurality of steel pins, each of which is covered by a non-metallic sleeve 32 to prevent the metal wafer carrier 22 from contacting the steel. The sleeves 32 are typically exposed to the solution during polishing. Each sleeve 32 is preferably made of a relatively soft material which is free of relatively hard plastics and composite reinforcing particles such as fiberglass, and is unlikely to be abraded, for the same reasons discussed above with respect to the carrier insert 24. A suitable soft material is polyamide-nylon 6/6 (nylon 66), PVDF or polyacetal. Note that other portions of the wafer carrier drive components may be exposed to the solution. Such portions are preferably made of, or coated with, the same type of relatively soft, non-marring material described above. Note that reduction of scratch-causing particles by use of these novel carrier drive components is applicable to other types of machines which remove material from the wafers.

In a method of this invention, each wafer W is sliced from the monocrystalline ingot. Pre-final polishing processing operations are suitably performed on the wafers W to remove bulk damage (i.e., crystal dislocations and stacking faults caused by the wafer slicing operation) in the wafer surfaces, to make the surfaces flat and to increase parallelism of the surfaces so that the front and back surfaces are substantially parallel. A suitable measurement of parallelism is Site Backside Referenced Indicated Reading (SBIR). Suitable wafers have average SBIR of about 0.075 microns on 26 mm×8 mm sites, and preferably about 99% of all such sites on the wafers have an SBIR of less than about 0.23 microns (referred to as the 99th percentile). Preferably, the pre-final polishing operations also improve the surface quality of the wafers W so that at least the front surface has a substantially mirror finish. Such processing operations may include, but are not limited to, lapping, etching, polishing plasma-assisted chemical etching (PACE) and magneto-rheological polishing. Preferably, one of the pre-final polishing operations is a simultaneous rough double surface polishing (DSP) operation. Note that this rough DSP operation is preferred, but other processing operations may be used to remove bulk damage, flatten the wafer surfaces and make the surfaces parallel. During rough polishing, about 27+/−10 microns of wafer material is typically removed from each wafer, the removal approximately evenly taken from both surfaces of the wafers.

After pre-final polishing (e.g., rough DSP) is complete, the wafers W are removed from the carriers 22 and cleaned before being transferred to a similar polishing apparatus 10 for final polishing. Preferably, no further material removal operation between the simultaneous rough polishing operation and the final polishing operation is performed, other than cleaning the wafer, so that no more than a minimal amount of material is removed between rough and final polishing. Material removal operations between rough and final polishing are generally undesirable because such operations may degrade wafer qualities imparted during rough polishing, especially the parallelism established by rough polishing. However, it is contemplated that further processing occur between rough and final polishing. For example, the wafers W may be treated to remove undesirable metals such as copper. Note that the method preferably does not include a single surface polishing operation wherein the back surface is substantially fixed against a backing surface, e.g., a wax-mount single surface polishing or a conventional CMP operation wherein the wafer is mounted in a retaining ring and is substantially fixed against a backing pad, membrane or template by friction and surface tension.

The final polishing operation is suitably begun by transferring the wafers W to the polishing apparatus 10. Generally, the wafers W are final polished generally by positioning each wafer in one of the wafer carriers 22 between the upper and lower pads 16, 18 of the polishing apparatus. Preferably, the back surface of the wafer W faces the upper pad 16 and the front surface faces the lower pad 18. A polishing slurry and other solutions described below are applied to at least one of the pads 16, 18. The upper pad is forced downward toward the back surfaces of the wafers to apply pressure thereto. Simultaneously, the wafer W, the upper pad 16 and lower pad 18 are rotated, and the wafer is made to orbit the axis of rotation of the platens in an epicyclic pattern or path wherein the front and back surfaces move relative to the pads to polish the wafers. It is not necessary that all three of the wafer W, upper pad 16 and lower pad 18 be moved so long as the wafer is moving relative to both pads. As will be further described below, the final polishing operation of this invention maintains parallelism and flatness and produces a finish on at least the front surface of the wafer so that the front surface is prepared for integrated circuit fabrication. Final polishing, as used herein, produces a mirror-finish surface, preferably on both surfaces, and at least the front surface is substantially free of damage caused by polishing and from prior processing such as rough polishing, lapping and etching. Further, the final polishing operation of this invention preferably produces a semiconductor wafer W having smooth, parallel and flat surfaces. In a batch of wafers, preferably most of the front surfaces have an average haze less than about 0.5 ppm, more preferably less than about 0.35 ppm, even more preferably less than about 0.18 ppm; preferably about 99% of the wafers have less than about 0.5, more preferably less than about 0.35 ppm, even more preferably less than about 0.18 ppm, with a standard deviation for the batch of preferably less than about 0.05 ppm, as measured by an ADE CR80 machine. Preferably, parallelism is not substantially changed, i.e., the average SBIR of the wafers does not substantially change, and preferably increases by no more than about 0.5 microns, more preferably no more than about 0.10 microns, more preferably by no more than about 0.05 microns. Likewise, preferably the 99th percentile reading described above is increased by no more than about 0.5 microns, more preferably no more than about 0.10 microns, more preferably by no more than about 0.05 microns. The site best fit focal plane deviation distribution of 26 mm by 8 mm sites on the front surfaces of the batch preferably does not exceed about 0.10 microns, preferably for at least about 99 percent of sites in the batch, more preferably about 0.07 microns for about 99% of sites, as measured by an ADE 9600 machine. Note that the preferred focal plane deviation is substantially achieved by prior processing operations, and the final polishing operation preferably degrades focal plane deviation in most 26 mm by 8 mm sites on the front surface by no more than about 0.04 microns, more preferably no more than about 0.02 microns. Such a wafer is smooth, planar and flat enough for integrated circuit fabrication after cleaning, e.g., an end user may form an integrated circuit on the wafer without further processing.

Suitable pads are mounted on the apparatus 10 for final polishing at least the front surfaces of the wafers W. In this embodiment, the upper pad 16 is a grooved rough polishing pad (typically referred to as an embossed pad) and the lower pad 18 is a finish-type pad, i.e., it has been formulated by the manufacturer to polish without substantally damaging the wafer surface. Typically, finish-type pads are softer and have significantly different roughness and porosity than that of rough polishing pads, such as the upper pad 16 and the pads used in the rough polishing operation. As an example, the upper pad is a Model 534E-II manufactured by Rodel of Phoenix, Ariz., the lower pad is a polyurethane pad such as Model SPM3100 pad manufactured by Rodel. The upper pad 16 may also be a grooved finish-type pad. It is preferable that the pads not include any scratch-causing fibers, such as composite reinforcing particles including fiberglass and felt. The Model 534E-II and SPM3100 pads are sized for a large batch polishing apparatus such as the AC1400. In this embodiment, the pads are sized significantly larger than the wafers because 15 or more wafers will be polished simultaneously between the pads. It is contemplated that a single wafer polishing machine be used in this invention. Importantly for the invention, at least the pad opposite the back surface should have a surface area significantly larger than the wafers W so that deviations in the pad opposite the back surface do not substantially affect the flatness of the front surface and such that the front surface and back surface are maintained substantially parallel after final polishing. It is preferred that at least the pad opposite the back surface, and preferably both pads be at least about 10 percent larger than the wafer W, more preferably about 50 percent, even more preferably 100 percent so that the wafer can move side-to-side as well as rotate relative to the back surface pad without any portion of the wafer surfaces extending out beyond the area between the pads. For a pad having a central hole such as the example pads given above, the difference between the inner and outer radius of the pad is at least 1.1 times greater than the diameter of the wafer W, more preferably about 1.5 times greater, even more preferably about 2 times greater. In other words, the wafer should be able to move substantially laterally between the pads without extending beyond the pad edge. Such construction limits the effects of deviations because the wafer is not continuously supported against the same portion of the pad during polishing and thus the deviations are "averaged out" during polishing, i.e., such deviations have no significant effect on flatness. Ensuring both pads are large enough so that no portion of the wafer surfaces extend out beyond the area between the pads is believed to ensure even polishing of the wafer or wafers during final polishing.

Generally, final polishing of the preferred embodiment is divided into an initial stage, a material removal stage, a smoothing stage and a rinsing stage. The wafers and pads are rotated during substantially all of these stages, and there is a flow of a polishing or rinsing solution to at least one of the pads. The platens are suitably held at a temperature between about 10° and 40° Celsius. The solution may include, but is not limited to, polishing slurry, de-ionized water (DI), an alkaline or caustic liquid component, and a rinsing fluid, as is further described below. The apparatus 10 has tube 19 described above for introducing and applying the solution to the pads.

Initial Stage

After the wafers W are placed in the carriers 22 and the upper pad 16 is lowered to a position adjacent the wafers W, solution including polishing slurry flows onto the pads 16, 18. In this embodiment, the pads are conditioned during the initial stage. Such conditioning helps to prepare the pads for polishing, especially where the pads have been thoroughly rinsed, as by DI water, between processing runs. The conditioning is suitably accomplished by mixing a strong base, such as potassium hydroxide (KOH) or sodium hydroxide, with the polishing slurry. Preferably, the base is sufficiently strong so that the solution between the pads (which includes slurry and KOH) has a pH of at least about 12, more preferably about 13. Also, relatively light pressure may be applied to the wafers by the pads as the pads are conditioned so that the wafers do not slip out of the carrier openings. For example, the pressure is no greater than 33 percent of the maximum pressure applied during the final polishing operation. Without being held to a particular theory, it is believed that mixing the strong base with the slurry dissolves some of the silica particles in the slurry, and possibly some of the wafer surface. The dissolved silica forms silicic and polysilicic acid which is intercalated in the pores of the pads 16, 18 or, more generally, is deposited on the pads. The intercalated or deposited silica is believed to reduce friction at the pad/wafer interface during material removal and smoothing stages to a more desirable level. Note that the conditioning step is not limited to a final polishing operation performed on a batch polishing apparatus. For example, the conditioning step may be used in rough or final polishing processes, single surface polishing or double surface polishing processes, and with single wafer or batch wafer polishing apparatus.

Kinematic Control and Wafer Orbit Paths

Hydrodynamic lubrication is viscous lubrication between two surfaces caused by relative motion between the surfaces in the presence of a fluid. Fluid between the surfaces flows from a regime of low pressure to high pressure due to a constriction in the fluid path, as due to a wedge profile or a step in one of the surfaces. Such a wedge profile or step is typically caused by small deformable pores in the pads 16, 18. It should be noted that the size of the wedge profile or step is typically on the order of microns. Boundary lubrication is lubrication between two surfaces due to a layer of molecules bound to one or both surfaces. In boundary lubrication, fluid may be expelled from between the wafer surface and the pad. There is also mixed or elastohydrodynamic lubrication wherein both hydrodynamic and boundary lubrication occurs.

Excessive or unstable hydrodynamic lubrication between the wafer W and either pad 16, 18 during polishing can cause the wafer to flutter or vibrate, which may damage the wafer or contaminate the solution in contact with the wafer. For example, if the wafer flutters or vibrates, the edge of the wafer rubs against the carrier insert 24 more frequently and with greater force so that the insert is likely to be abraded and release scratch-causing particles into the solution. Note that even the preferred carrier insert materials described above typically contain some impurities and/or scratch-causing particles. Also for example, the amplitude of vibrations can be so great that fluid in a particular area may be completely squeezed away, causing increased localized stiction and thereby causing surface damage. Also for example, the amplitude of the vibrations can be so great that the wafer is forced out of the opening in the carrier, which will damage or break the wafer. Preferably, the kinematics of the process are controlled to inhibit unstable hydrodynamic lubrication between the pads and the wafer W during the initial, material removal and smoothing stages, and suitably between the upper pad 16 and the back surface during the rinsing stage, to thereby inhibit abrasion of the carrier insert 24 and damage to the wafer during final polishing. Preferably, such kinematic control promotes elastohydrodynamic or boundary lubrication and therefore less separation between the surfaces and the pads. In contrast during the rinsing stage, stable hydrodynamic lubrication is promoted between the front surface and the lower pad 18, while hydrodynamic lubrication is not necessarily promoted between the second pad and the back surface.

The kinematics of the process are generally controlled to inhibit unstable hydrodynamic lubrication. Such control is suitably accomplished by selecting appropriate rotation speeds of the wafer carrier 22, and the upper and lower pads so that the velocity of the back surface relative to the upper pad 16 is less than the velocity of the front surface relative to the lower pad 18. Such control is especially helpful during the rinsing stage wherein the wafers would otherwise tend to uncontrollably "hydroplane", i.e., vibrate and flutter, due to the increased viscosity of the rinsing fluid and decreased pressure against the wafer.

Equations defining the motion of the carriers and wafers as they orbit the center of the apparatus 10 can be used to determine rotation speeds that will ensure that relative velocity of the back surface relative to the second pad is less than the velocity of the front surface relative to the first pad. Importantly, the equations are preferably used to also ensure that each wafer does not follow substantially the same path during each orbit around the center of the apparatus. Such a repeating path degrades the flatness and parallelism of the wafer and unevenly wears the pads. Preferably, the wafer surfaces are exposed evenly to all parts of the pads (referred to as even sampling). For example, the equations of motion for this apparatus are given as follows:

$$N_c = \frac{n_4 R_r + n_3 R_s}{R_r + R_s}$$

(1.0) Rotation speed of the wafer carrier about the center of the apparatus (negative sign indicates counter-clockwise rotation)

$$N_p = \frac{n_4 R_r - n_3 R_s}{2 R_p}$$

(1.1) Rotation speed of the wafer carrier about its own center $$N_w = \frac{n_1 + n_2 - 2N_c}{2}$$

(1.2) Estimated rotation speed of the wafer about its own center

The variables are defined in this embodiment as follows:

| | |
|---|---|
| $R_a$ = 12.4 cm | Distance from the center of the carrier to the center of a 200 mm wafer |
| $R_b$ = 0 cm | Distance from the ceter of the wafer to any radial point (in this example, the path of the ceter point is plotted) |
| $R_p$ = 27.15 cm | Radius of the carrier |
| $R_s$ = 20.2 cm | Sun Gear or inner gear radius |
| $R_r$ = $R_s$ + 2$R_p$ | Outer ring gear radius |
| $R_o$ = $R_s$ + $R_p$ | Midpoint between sun gear and ring gear |
| $n_1$ | Rotation speed of the upper pad |
| $n_2$ | Rotation speed of the lower pad |
| $n_3$ | Rotation rate of the sun gear |
| $n_4$ | Rotation rate of the ring gear |
| t | Time |

It is convenient to compute $n_3$ and $n_4$ from desired values of $N_c$ and $N_p$:

$$n_3 = \frac{-1}{2} \frac{(2N_p R_p - N_c R_r - N_c R_s)}{R_s}, \quad (1.3)$$

$$n_4 = \frac{1}{2} \frac{(2N_p R_p + N_c R_r + N_c R_s)}{R_s}. \quad (1.4)$$

The following are convenient for computational purposes when $n_1$ and $n_2$ are in units of rpm. A subscript t refers to the upper pad, and a subscript b refers to the lower pad:

$$\alpha = \frac{2\pi}{60} N_c, \beta = \frac{2\pi}{60} N_p, \gamma = \frac{2\pi}{60} N_w, \phi_t = \frac{2\pi}{60} n_1, \phi_b = \frac{2\pi}{60} n_2,$$

First, one computes the motion with no rotation of the pads, which is the motion of the wafers in a fixed reference frame (equation 1.5). Then, the whole system is rotated to get the relative motion of the wafer over either pad.

$$X_{nb}(t)=R_a \cos(at)+R_a \cos(bt)+R_b \cos(ct) \ Y_{nb}(t)=R_a \sin(at)+R_a \sin(bt)+R_b \sin(ct) \quad (1.5)$$

$$X_b(t)=X_{nb}(t)\cos(\phi_b t)+Y_{nb}=(t)\sin(\phi_b t) \ Y_b(t)=-X_{ab}(t)\sin(\phi_b t)+Y_{ab}(t)\cos(\phi_b t) \quad (1.6)$$

$$X_t(t)=X_{nb}(t)\cos(\phi_t t)+Y_{nb}(t)\sin(\phi_t t) \ Y_t(t)=-X_{ab}(t)\sin(\phi_t t)+Y_{ab}(t)\cos(\phi_t t) \quad (1.7)$$

Equations (1.6) and (1.7) describe the position of the center of the wafer with respect to the pad as a function of time. The curve traced by the wafer center during rotation is a curtate epitrochoid. One may differentiate the equations to find the velocity components and thereby the instantaneous relative velocity at any position as a function of time. The results of such differentiation are long and will not be reproduced herein. FIG. 4 shows examples of calculated average relative velocities between the upper pad and back surface ($v_{top}$) and between the lower pad and the front surface ($v_{bottom}$) in centimeters per second, using an approximation of the exact velocity given by differentiating the equations.

Suitable rotation speeds should be chosen so that the wafer path does not follow the same path repeatedly, and so that the kinematics of the process are suitably controlled. Preferably, the speeds are selected such that a point on the wafer does not follow the same path about the center of the apparatus 10 before the wafer has completed at least about 10 percent of the total number of rotations to be made by the wafer about the apparatus center during the final polishing process, more preferably at least about 25 percent, even more preferably at least about 50 percent. One method of finding a desirable path is to determine which speeds result in undesirable paths and then change to speeds which are intermediate those undesirable speeds, i.e., significantly different from those speeds, to find a desirable path. For example, the condition for a path that retraces itself once per carrier rotation is:

$$|N_c|\pm m|N_p|=n_1 \text{ or } n_2 \quad (1.8)$$

Where m is any arbitrary integer. Nearly repeating paths follow the condition m=1/2, 3/2, 5/2 . . . ∞.

Figure 3A:
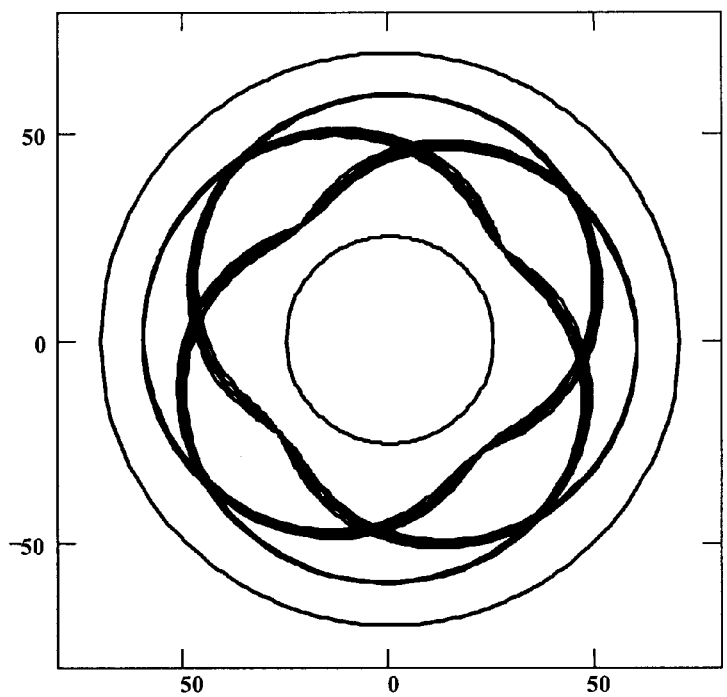
FIGS. 3A–D are plots of a wafer path as the wafer orbits the center of the polishing apparatus, FIGS. 3A and 3B showing undesirable paths and FIGS. 3C and 3D showing desirable paths for 16 carrier rotations about the carrier center.
Figure 3B:
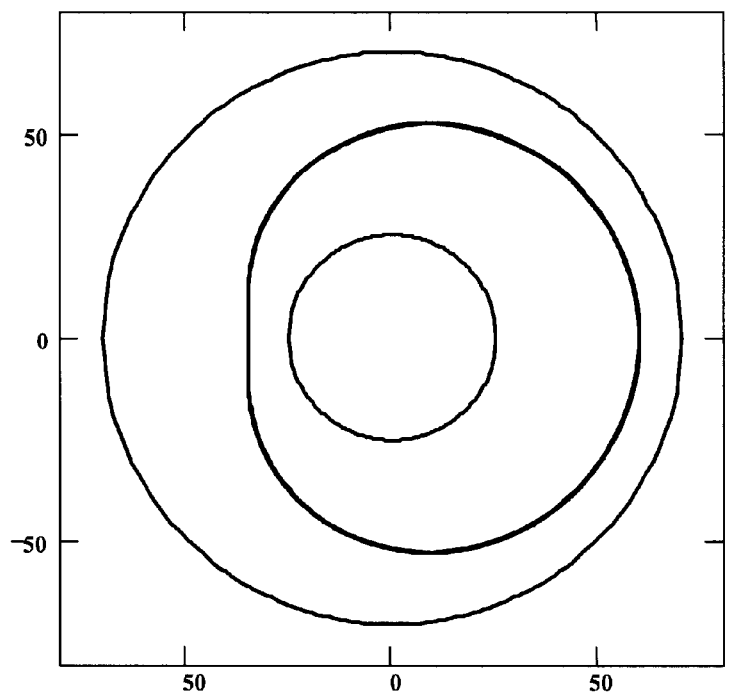
Figure 3C:
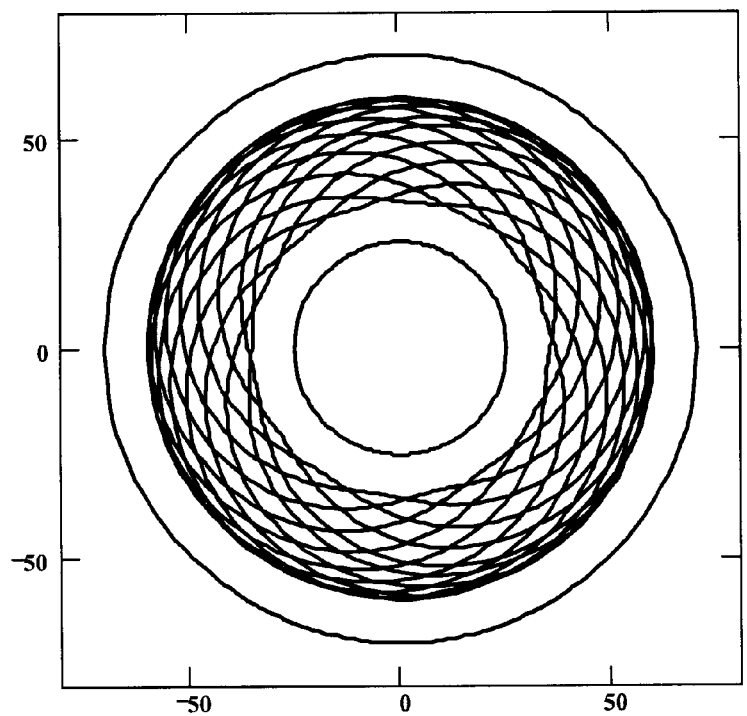
Figure 3D:
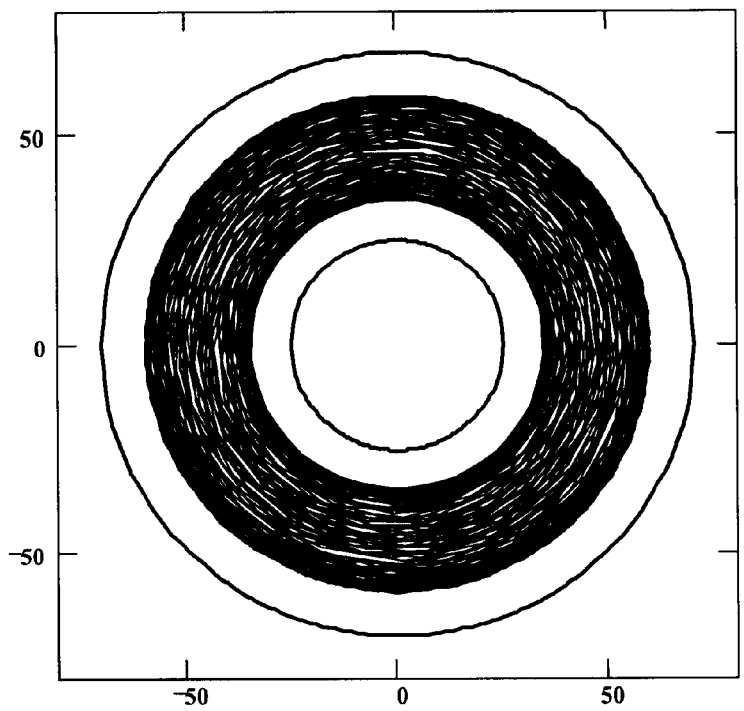
Figure 6A:
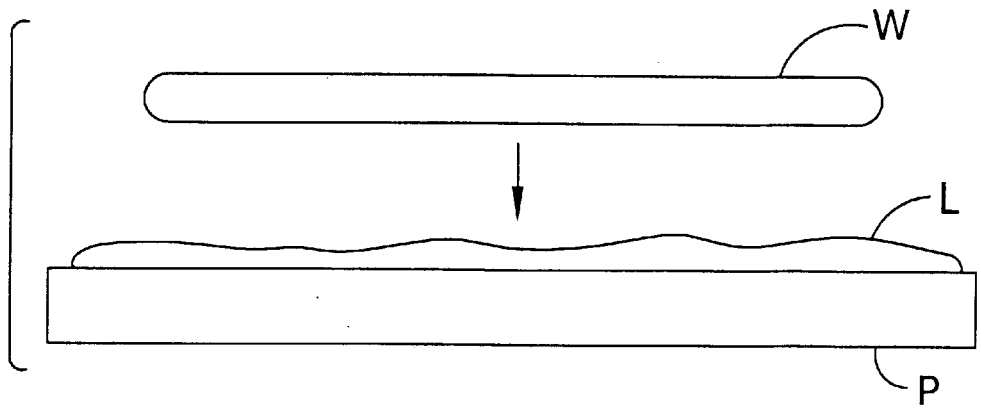
FIGS. 6A–D summarizing a wax mounted polishing operation of the prior art.
Figure 6B:
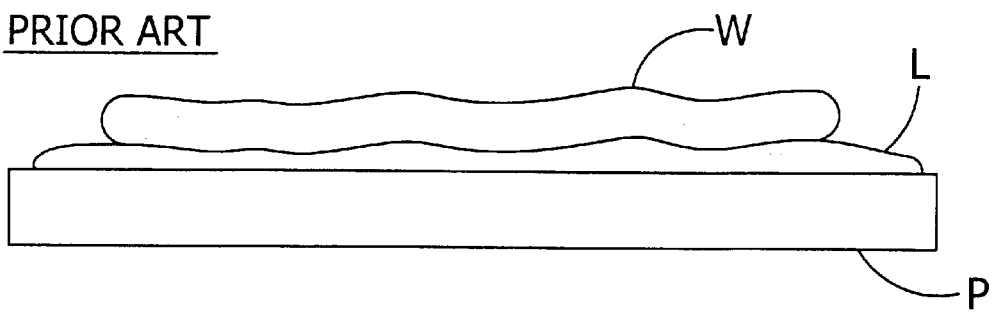
Figure 6C:
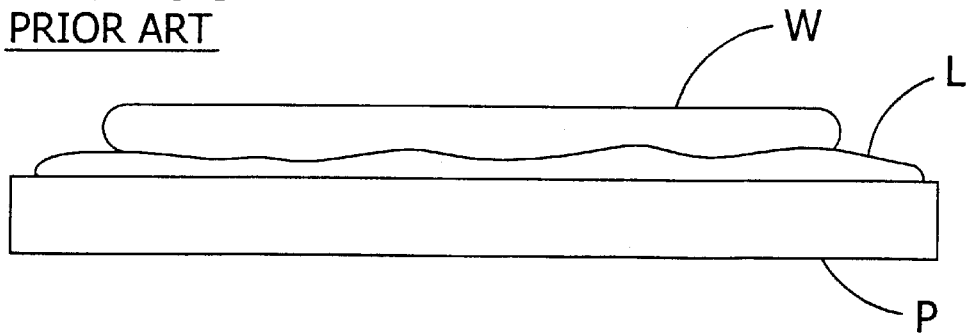
Figure 6D:

Wafer paths which evenly sample the pads can be found by selecting rotation speeds which are significantly different than those specified by the constraint Equation (1.8). By plotting the paths (e.g., using a program such as MATHCAD™) one can graphically view the wafer paths caused by selected rotation speeds and then determine whether the speeds selected will result in a pattern which evenly samples substantially all of the pad. For example, FIGS. 3A and 3B show undesirable paths in which the wafer follows the same or similar paths each time around the center of the apparatus. In contrast to FIGS. 3A–3B, FIGS. 3C and 3D show desirable paths in which the wafer does not repeat the same path around the center of the apparatus until the carrier 22 has rotated about its own center at least 16 times. FIG. 3D, which is the path of the wafer with respect to the lower pad, is an excellent choice since it samples substantially all of the pad. Note that the boundaries of the pad (the inner and outer circles) are shown in FIGS. 3A–3D. In addition to avoiding the path of the constraint equation, the following guidelines are preferably applied to find a satisfactory wafer path.

1) Upper and lower pads should counter-rotate to ensure proper distribution of the solution in contact with the wafer, i.e., $n_1$ and $n_2$ should have opposite signs.
2) The wafer carrier should rotate around the machine in the same direction as the upper pad, i.e., $N_c$ and $n_1$ must have the same sign.
3) No point on the wafer surfaces should be allowed to stop with respect to either pad (i.e. the paths are cuspless).
4) The wafer path should orbit the sun gear before crossing its own path.
5) The outer gear may be kept motionless if the friction between the pads and wafers is too high.

A few examples of settings that obey these guidelines are shown in FIG. 4. The table of FIG. 4 represents settings found suitable for an AC1400 apparatus, though use of the settings for other polishing apparatus is contemplated. In FIG. 4, time is in seconds and rotation speeds are in RPM. A negative sign indicates counter-clockwise rotation.

Setting 1 is particularly suitable for use with a SUBA 534E-II upper pad and a UR100 lower pad, and wherein the maximum process pressure is about 4.8 kPa. Settings 2–6 are more suitable for a SPM3100 lower pad for which preferred maximum pad pressure is about 9.7 kPa and wherein the outer gear is not rotating. Note that with use of the SPM3100 pad, friction was found to be so high that the outer gear of the AC1400 apparatus could not be reliably rotated without eventually damaging its driveshaft. As can be seen, settings determined according to this method will cause even pad wear, and can suitably be used to ensure that the velocity of the back surface relative to the second pad is less than the velocity of the front surface relative to the first pad. Moreover, in a polishing apparatus 10 having orbiting carriers, the wafers will both rotate and move laterally with respect to the pads, such movement with respect to the upper pad is of particular importance to "average out" any imperfections in the upper pad and thereby ensure the flatness and parallelism of the wafers. Note that these settings may be further optimized, and that settings optimized for particular polishing apparatus, pads, pressures, fluid viscosity and flow rate may not be optimal when any of the apparatus, pads, pressures, fluid viscosity or flow rate are changed.

Kinematics may also be controlled to cause differential removal, i.e., to cause less material removal from the back surface than the front surface, due to less relative motion between the back surface and the upper pad 16 than between the front surface and the lower pad 18. As can be seen, such removal is likely to occur using the settings shown in FIG. 4 because there is less relative motion between the back surface and the upper pad 16 than between the front surface and the lower pad 18. Alternatively, kinematics may be controlled to cause equal material removal from the front and back surfaces.

Preferably, unstable hydrodynamic lubrication is further controlled by use of a grooved upper pad, such as the SUBA 534E-II pad. Use of such a pad causes the solution in the interface between the pad and the wafer W to be channeled away from the interface through the grooves. In this way, unstable hydrodynamic lubrication between the upper pad 16 and the back surface of the wafer is inhibited.

Again, control of unstable hydrodynamic lubrication is particularly important during the rinsing stage wherein it is more likely to occur and cause damage to the wafers.

Pressure and Carrier Wear

Preferably, the wafer carrier 22 has a thickness less than a final thickness of the wafer W after final polishing is complete. Preferably, the wafer carrier thickness is at least 15 microns less than the final thickness and more preferably about 70 microns less. The preferred difference will depend on the compressibility of the pads. Pressure exerted by the pads against the carrier 22 is minimized, e.g., pressure is nearly the same as ambient pressure, because the carrier is so much thinner than the wafer and therefore the pads tend to bear against the wafer W, or more correctly, the pressure bears against the liquid and slurry particles at the pad/wafer interface, the pad being separated from the wafer by the liquid and the slurry particles. By minimizing pressure against the carrier 22, carrier wear is reduced. Carrier wear can cause metal or metallic impurities in the metal portion of the carrier 22 to be released and contaminate the pad or the polishing solution. Carrier wear can also cause scratch-causing particles to be released from the inserts 24. Further, minimizing pressure applied to the carrier 22 (the carrier preferably having a thickness which is substantially thinner than the thinnest wafer in a batch) helps to maintain the pressure applied to the wafer W by the polishing pads relatively constant and thereby makes the process repeatable regardless of the starting thickness of the wafer. Note that conventionally, the applied pressure on the wafer decreases during polishing because the wafer becomes gradually thinner during polishing, the pressure exerted on the carrier 22 becoming greater as the thickness of the wafer approaches the thickness of the carrier.

Pressure applied during the material removal stage is preferably at least about 7 kPa, more preferably between about 7.5 and about 12.1 kPa , where the lower pad is an SPM31000. During smoothing, pressure is at least about 5.5 kPa and more preferably between about 6 and about 11 kPa. During the rinsing stage, less than about 2 kPa is applied or more preferably, the least possible pressure the apparatus can apply without causing the wafer W to oscillate excessively, e.g., about 0.75 kPa for an AC1400 apparatus. The pressures applied in all stages are sufficiently low so that the final polishing operation causes substantially no crystal structure damage in the wafer. The preferred pressures may vary with pad type, polishing apparatus, polishing slurry, fluid properties and temperature.

Slurry and Rinsing Fluid

Preferably, the polishing slurry is a finish-type slurry, such as GLANZOX™ 3950, available from Fujimi of Elmhurst, Ill. It has been found that finish-type slurry is more suitable for the final polishing operation in that wafers produced using finish-type slurry have less average haze than those produced using the less expensive stock removal polishing slurry typically used for rough polishing. Without being held to any one theory, it is believed that slurry particles and agglomerates found in the stock removal polishing slurry are generally larger and harder to break up than slurry particles and agglomerates in the finish-type slurry, and thus more likely to cause scratches and haze in the wafer surfaces. It is contemplated, however, to use the stock removal polishing slurry, especially during the material removal stage of final polishing. It is contemplated that other finishing slurries can be used, or various slurries can be used separately or in combination in any one step.

In order to increase the wafer material removed during the material removal stage, it is preferred to mix a strong base with the finish-type polishing slurry. Examples of a strong base are potassium hydroxide and sodium hydroxide. Ammonia and a polymer may also be added to the slurry. In addition, relatively high pressure is applied during the removal stage, the ranges of pressure being described above. By using a strong base and high pressure, an appropriate amount of wafer material (as described below) is removed while using relatively little finish-type polishing slurry.

The finish-type slurry is stabilized against agglomeration of the silica particles by polymers and by a base, such as KOH or ammonia. Commercially available slurries such as GLANZOX 3950 typically include a proprietary polymer, such as a modified cellulose, while a base is typically mixed with the slurry during the process. In this embodiment, ammonia is preferably mixed with the slurry during substantially all stages of the process. In contrast, KOH is preferably only added during the initial stage and the material removal stage, though it may also be a minor component of the rinsing fluid. KOH serves mainly to adjust the slurry pH above about 10.5, and preferably between about 10 and 200 milimolar of KOH is added during the material removal stage. The KOH also helps to maintain the ionic strength. Preferably the ionic strength is between about 10 and 200 milli-molar during the initial and removal stages.

Ammonia serves to chemically sequester complex trace metals such as copper and nickel, to control pH in the latter portion of the smoothing stage and serves as a component of the pH buffer in the rinsing process. If the apparatus has been idle for an extended length of time, the ammonia serves to purge the tube 19 through which the fluids flow. In addition to stabilizing, ammonia serves to purge the tube 19 through which the fluids flow.

The optimum concentration of silica particles in the slurry is expressed as the percent by volume silica solids. Preferably, the optimum concentration provided by the supplier is maintained. In this embodiment, preferred slurry GLANZOX 3950 has an optimum concentration of about 0.035 to 0.055% by volume silica solids. The optimum concentration is maintained by diluting with water and with other aqueous solutions as described above.

Material Removal

The final polishing operation preferably removes relatively little wafer material so that flatness and parallelism are not substantially degraded. The final polishing operation suitably removes less than about 5 microns of wafer material from the wafer W and preferably between about 0.1 and 1.5 microns of wafer material. It is to be noted that less than 0.4 micron total material removal from the wafer is likely to be preferred where the wafer W to be final polished has substantially no surface damage, e.g., where the rough DSP process is suitable to produce a wafer having substantially no surface damage. In fact, where substantially no surface damage is present less than 0.1 microns of wafer material may be removed. Note that the ranges given represent total removal from both surfaces of the wafer. The kinematics are preferably controlled as described herein so that significantly more material is removed from the front surface than the back surface. Preferably, material removal from the back surface is less than about 25% of the removal from the front surface.

Smoothing Stage

The smoothing stage operates at slightly reduced pressure to reduce the force transmitted through the particles into the wafer surface. Lowering ionic strength (e.g., by reducing KOH concentration) in the smoothing step helps to break up agglomerates of silica in the slurry and on the pad and wafer. It is believed that biasing the population of slurry particles toward smaller sizes, i.e., so that they are substantially individual particles, provides the mild polishing action that smooths the surface on the nanometer scale.

It is well known in the art that alkaline etching of silicon wafers preferentially exposes <111> planes, causing an undesirable faceting of the surface in polishing operations. In smoothing, the ionic strength is reduced by dropping the KOH concentration and consequently the pH to reduce the rate of alkaline etching of the surface relative to the polishing rate.

Rinsing Stage

After the wafer W has been polished substantially and smoothed completely, the wafers are preferably rinsed while rotation of the wafers continues and slight pressure is applied. It is to be noted that the rinsing stage of this invention may be used in a single wafer polishing process as well as the batch polishing process described herein, especially where the wafer is to remain on the pad for some period of time in contact with potentially harmful caustic solution on the pad or in the pores of the pad. In this embodiment, rinsing fluid is introduced to flush away the polishing slurry and potentially damaging caustic solution. As polishing slurry is washed away during rinsing, there is an increased risk of instability (flutter and vibration) and therefore direct contact between the wafer W and the pad. Such direct contact would increase the contact force between the pad and wafer and thereby cause surface damage in the wafer W. The increased contact force is typically accompanied by an audible squeal. To avoid direct contact, the distance between the pad and the wafer W is preferably increased by increasing the hydrodynamic lubrication between the front surface and the lower pad 18. The hydrodynamic lubrication is preferably increased at the start of rinsing in a short step which includes reducing the pressure exerted by the pads significantly, continuing a flow of polishing slurry to the pads and introducing a flow of higher viscosity rinsing fluid to the pads. The rinsing fluid increases hydrodynamic lubrication between the front surface and the lower pad 18 and thereby increases the distance therebetween. Briefly continuing the flow of slurry provides a boundary lubricant during the potentially unstable transition period to protect the wafer from contact with the pad. The wafer W should stabilize relatively quickly during the short step, and thereafter the flow of polishing slurry can be stopped. Preferably, rinsing is accomplished in three steps: 1) introducing a flow of rinsing fluid through the tubing to the upper pad while continuing flow of the polishing slurry to the upper pad so that the wafer is stable before the flow of polishing slurry is stopped; 2) stopping flow of the polishing slurry while continuing flow of the rinsing fluid; and 3) adding a passivation component, such as hydrogen peroxide, to the rinsing fluid for passivating the front surface against alkaline etching.

The rinsing fluid preferably has relatively high viscosity to increase hydrodynamic lubrication at the pad/wafer interface. Preferably, the fluid includes a polymer, such as polyethylene oxide (PEO), carboxymethyl cellulose, xanthan gum, carboxymethyl starch or ethylhydroxy cellulose, to increase its viscosity. Preferably, the polymer is neutral or is capable of holding a negative charge, and not a positive charge, in alkaline solution. Preferably, the polymer adsorbs to the surfaces of the wafer and to residual slurry particles to inhibit the agglomeration and adhesion of silica particles. The rinsing fluid has a viscosity at least 2 times greater than the viscosity of the polishing slurry, more preferably at least about 4 times greater. For example, the polishing solution has a viscosity of about 1 centipoise (cp) at about 25° C. prior to addition of the rinsing fluid, and about 6–7 cp after addition of the rinsing fluid.

The rinsing fluid preferably also includes a pH buffering fluid which buffers the solution pH against caustic liquids, i.e., liquids having a pH greater than 11.8, trapped in the pads to protect the front surface of the wafer W. Prior to rinsing, caustic liquids such as KOH become trapped in the pads, especially in pores of the pads. The rinsing stage typically does not rinse the pad for sufficient time to completely rinse away the most damaging caustic liquids from the pads. It is believed complete rinsing would take about 3 minutes or more, while the preferred rinsing stage is much shorter to inhibit accumulation of surface defects in the wafer W and to increase throughput. Moreover, after the rinsing stage is complete, it takes several minutes to remove all the wafers from the apparatus, during which time residual caustic liquids may etch the surfaces of the wafers. Therefore, the rinsing fluid is pH buffered against residual caustic liquids trapped in the pads to protect the front surface of the wafer W. However, the pH buffering fluid has an appropriate pH so that the pH of the solution does not drop so low as to cause silica particle agglomeration, excessive precipitation of silicic acids, or silica particle adhesion to the wafers. Such agglomeration and particle adhesion to the wafer typically accelerates when the pH drops substantially below 7.8 or becomes acidic during rinsing. Preferably, the pH buffering fluid of the rinsing fluid is selected to maintain the pH of the solution in contact with the wafers so that it is alkaline, more preferably between about 7.8 and 11.8, more preferably between about 8.8 and 10.8, most preferably about 9.8. The pH buffering fluid has an ionic strength of between about 0.5 and 10 milli-molar and preferably about 2 milli-molar. This range of ionic strengths provides sufficient pH buffer capacity without disrupting the electrostatic stabilization of the colloidal slurry against agglomeration. Note that the solution in contact with the wafers is likely to include polishing slurry, especially during step 1 of rinsing, and the pH ranges given are for the solution including the rinsing fluid and the polishing slurry. A suitable pH buffering fluid includes an acid and a base, preferably boric or phosphoric acids mixed with KOH or ammonia. Preferably, the acid has a pka between 6.9 and 10.5 and more preferably the pka is about equal to the target pH, e.g., about 9.8.

The rinsing fluid also preferably includes a passivation component, which may be suitably added to the rinsing fluid just prior to the end of the rinsing stage. The passivation component is suitably hydrogen peroxide, though other oxidizers may be used, such as ozone or ammonium nitrate/nitrite. Thus, the rinsing fluid passivates the wafer surfaces to further protect the surfaces from harmful caustic solution while the wafer rests on the pad after completion of final polishing.

Post Polishing Handling

After polishing is complete, rotation of the carrier 22 and pads 16, 18 is stopped and the wafers are removed from the polishing apparatus and dried. Air drying the wafers may cause residual silica to precipitate on the wafer surfaces and thereby become difficult to remove from the wafer. In this embodiment, the front surface of the wafer is treated, e.g., sprayed, with a protectant for inhibiting particle adhesion to the front surface. The back surface may also be sprayed. The protectant is suitably an aqueous solution of a polymer such as PEO or other suitable polymers discussed above. In this embodiment, the aqueous solution is pH neutral for the safety of the user, though it may be preferred, especially where the process is automated, to use an alkaline buffered solution. PEO and the aforementioned polymers are suitable in that they adsorb strongly to silica surfaces and thereby protect the wafer surface from particle adhesion. Note that this post-polishing surface treatment may be used after any polishing operation, including single-surface polishing.

The wafers are also immersed in a bath to remove particles from the wafers, coat the particles and the wafers with a polymer and to maintain a passive oxide layer on the front surface of the wafer. Preferably, the bath is a solution including ammonia, an oxidizer, such as hydrogen peroxide, and PEO at or near the same pH as the final rinsing fluid. The wafers are removed from the bath after a relatively short period of time, e.g., three minutes, then rinsed and dried in a suitable apparatus.

Upon completion of the final polishing process, the front surface of the wafer is final polished so that after cleaning the front surface is prepared for integrated circuit fabrication. It is contemplated that the back surface may also be final polished in the process. The method of this invention does not require any coating or layer. After the wafer is cleaned and inspected, it is typically packaged and shipped to a customer for forming integrated circuits on the wafer. However, it is contemplated that a coating or layer, including an epitaxial layer, be added. For example, layers or coatings may be added by the wafer manufacturer or by a customer.

EXAMPLE

An example final polishing process is described in table form in FIGS. 5A and 5B. In the example, the polishing apparatus is an AC1400, the upper pad is a SUBA 534E-II, the lower pad is a SPM3100, and Glanzox 3950 is the polishing slurry. The wafer carriers use PVDF fiber free inserts, and the pin sleeves are also fiber free Nylon 6—6. In FIG. 5A, the first column shows that there are eight steps in the process and successive columns include parameters for each step in the process. The next two columns record the time, in seconds, of each step and the percentage of solids (i.e., silica solids found in the polishing slurry) in the solution flowing to the pads. Successive columns show the moles per liter of flow of hydrogen peroxide ($H_2O_2$), phosphoric acid ($H_3PO_4$) and KOH. Further columns show PEO in grams per liter, ammonia ($NH_4OH$) and isopropyl alcohol (IPA) in moles per liter, the Debye length, the ionic strength, and the normalized Hersey number ($H_o$) for the front and back surfaces. The several columns of FIG. 5B show the pH of the solution, the flow rate of the solution in milliliters per minute, the pressure in kPa and the rotation speeds. Note that the rotation speeds correspond to setting 2 in FIG. 4. The average relative velocities between the lower pad and the front surface and between the upper pad 16 and the back surface are calculated as described above and shown in the next four columns. Note that the velocity between upper pad 16 and back surface is substantially lower, e.g., less than half, than that between the lower pad and front surface in each step. The initial speeds are sufficiently low to allow time for the fluid properties and frictional properties of the pads to stabilize.

In this example, initial steps 1 and 2 constitute the initial stage during which time the pads are conditioned. Steps 1 and 2 last only about 18 and 24 seconds, respectively. Pressure is increased substantially in the wafer removal stage of step 3, which lasts the longest of any steps, about 8 minutes. The smoothing stage is substantially constituted by steps 4 and 5, the pressure being reduced moderately in step 4 from the removal stage and the flow of KOH being suitably stopped after step 4. As described above, the first step of the rinsing stage (step 6) lasts a short time, in this case only about 6 seconds, during which time the polishing slurry continues to flow (while the wafer-pad separation distance stabilizes), as indicated by the 0.045 percent solids, and while the flow of buffer fluid, PEO and IPA is begun. In addition, the flow of ammonia (a component of the pH buffer) is increased. Note that for this apparatus, minimum step time is 6 seconds. In step 7, slurry flow is stopped and rinsing continues at about the same flow rates for 18 seconds. Hydrogen peroxide is introduced in step 8. As shown, the entire rinsing stage lasts less than a minute. The rinsing fluid causes the viscosity of the solution between the pads to jump from about 1 cp to about 6.4 cp while the temperature of the solution remains substantially the same. The final polishing operation lasts about 14 minutes total, and about 0.5 microns is estimated to be removed from each wafer. Note the removal rate depends on the level and type of dopant in the wafer, the removal estimate being given for on the order of about $10^{19}$ atom/cm$^3$ of boron in a silicon wafer.

Note that the Debye length (1/K) is a characteristic exponential decay length for electric fields in electrolyte solutions. The parameter is a measure of the distance at which the forces between charged surfaces become apparent.

When analyzing 1:1 electrolytes such as KOH, Debye length can be determined from the concentration c (in moles/liter) of the electrolyte by the equation:

$$1/K = 3.04/c^{-2} \text{ in Angstroms at } 25° \text{ C.}$$

Because the attractive van der Waals forces between surfaces can overcome electrostatic repulsion when particles move closer than some critical distance, the stability of a colloidal system, such as the solution in contact with the wafer, partly depends on the electrostatic repulsion extending a longer distance than the van der Waals force. As a rule of thumb, in alkaline silica systems a Debye length of at least about 30 Angstroms is preferred to ensure colloidal stability by electrostatic repulsion. Such a Debye length corresponds to an ionic strength of about 10 milli-molar. In steps 1–3 of the Example, the ionic strength is between about 10–200 milli-molar, while in subsequent steps it is below about 10 milli-molar corresponding to the decrease in the flow of KOH. Note that the values given are for silicon wafers polished by silica slurry in alkaline conditions. For other systems, other constraints should be added, e.g., that the pH of the solution is at least about 2 pH units away from the point of zero charge of the slurry particles, and the sign of the charge of the slurry particles and the polished surface should be the same or, in the alternative the surface may be electrically neutral. These constraints are satisfied in the Example.

The Hersey number is defined as the fluid velocity times viscosity divided by pressure (as defined by lubrication theory). The Hersey number may be expressed in microns and is proportional to the square of the thickness of the liquid film between the pad and the wafer. The Hersey number may be used to choose parameters corresponding to the hydrodynamic conditions of the Example for another polishing apparatus whose mechanical capabilities are not equivalent, e.g., an apparatus which cannot rotate the wafers at the same speed. Further, the Hersey number serves to distinguish hydrodynamic conditions among sub-steps, e.g., between material removal and rinsing. The Hersey number shown in FIG. 5A is unitless because it is expressed as a relative Hersey number, the nominal Hersey number being 0.36 in step 3, front surface, the other Hersey numbers being scaled therefrom. Preferably, when translating the exemplary process to another polishing apparatus, the Hersey numbers vary by less than about 50% from those shown in FIG. 5A, more preferably by less than about 25%.

Wafers processed according to this method are flatter and the surfaces more parallel than conventionally polished wafers. The wafers have equal or less diffuse scattering of incident light (average haze). As discussed above, the final polishing operation of this invention preferably produces a semiconductor wafer W having planar, parallel and flat surfaces. Typical front surface haze levels average 0.18 ppm or less with a standard deviation for a batch of wafers of about +/−0.05 ppm as measured by an ADE CR80 machine. Typical flatness is degraded in the final polishing operation by no more than about 0.02 microns on any 26 mm×8 mm site as measured by an ADE 9700 machine. The average change in SFQR is excellent in that it is below the resolution of the instrument. Deviations from planarity, as measured by the distribution of SBIR, is typically increased by no more than 0.075 microns for 99 percent of 26 mm×8 mm sites in the batch measured by an ADE 9700 machine. The average change in SBIR was found to be below the resolution of the instrument. With respect to nanotopography, about 99% of all sites on the wafers polished using this final polishing operation have nanotopography less than 55 nanometers over 99.5% of the front surface using a 10 mm by 10 mm site as measured by an ADE CR83 machine.

The method of this invention also improves wafer throughput in that the final polishing is a batch process, as compared to conventional single surface wax mount polishing wherein only one wafer at a time is processed. In this example using the AC1400 apparatus, about 38.5 wafers are processed per hour while allowing 10 minutes for loading and unloading. With a conventional single surface wax mount polisher, only about 10 wafers are processed per hour.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method of manufacturing a semiconductor wafer having a front surface and a back surface, the method comprising the operations of;

providing an ingot of semiconductor material;

slicing the wafer from the ingot;

processing the wafer to increase parallelism of the front surface and the back surface; and final polishing the front surface by:
  a) positioning the wafer between a first pad and a second pad, and
  b) obtaining motion of the front and back surfaces of the wafer relative to the first and second pads to maintain parallelism of the front and back surfaces, to remove less than about 1.5 microns of wafer material and to produce a finish on at least the front surface of the wafer so that after cleaning the front surface is prepared for integrated circuit fabrication.

2. A method as set forth in claim 1 wherein the final polishing operation removes between about 0.1 and 1.5 microns of wafer material.

3. A method as set forth in claim 1 wherein the processing operation includes simultaneously rough polishing the front and back surfaces of the wafer.

4. A method as set forth in claim 3 wherein the final polishing operation removes material simultaneously from both surfaces of the wafer.

5. A method as set forth in claim 3 wherein the final polishing operation removes between about 0.1 and 1.5 microns of wafer material.

6. A method as set forth in claim 3 wherein the method is free of any material removal operation between said simultaneous rough polishing operation and said final polishing operation other than cleaning the wafer.

7. A method as set forth in claim 3 wherein the rough polishing operation produces a substantially mirror finish on at least the front surface, the rough polishing operation being performed in a first polishing apparatus and the final polishing operation is performed in a second polishing apparatus, both apparatus being adapted to simultaneously batch process multiple wafers.

8. A method as set forth in claim 3 wherein the method is free of an operation for forming a layer on the wafer.

9. A method as set forth in claim 3 wherein the method is free of a single surface polishing operation wherein the back surface is substantially fixed against a backing surface.

10. A method as set forth in claim 3 wherein the wafer is packaged after said final polishing operation.

11. A method as set forth in claim 1 wherein the final polishing operation further comprises:
  (a) providing a polishing apparatus having a wafer carrier generally disposed between the first pad and the second pad,
  b) placing said wafer in the water carrier so that said front surface faces said first pad and so that said back surface faces said second pad, the wafer being free to move relative to the first and second pads,
  (c) applying a polishing slurry to said pads,
  (d) rotating at least one of the carrier, first pad and second pad for polishing at least said front surface of said wafer.

12. A method as set forth in claim 11 wherein the operation of providing a polishing apparatus includes providing the polishing apparatus free of composite reinforcing particles in contact with the wafer, the pads or the polishing slurry so as to inhibit particle contact with the wafer.

13. A method as set forth in claim 11 wherein the operation of providing a polishing apparatus includes providing the polishing apparatus including carrier drive components adapted to be in contact with the polishing slurry, the drive components and wafer carriers having substantially no fiberglass therein so that fiberglass particle contact with the wafer is inhibited.

14. A method as set forth in claim 11 wherein the final polishing operation removes between about 0.1 and 1.5 microns of wafer material.

15. A method as set forth in claim 11 wherein the final polishing operation removes significantly less water material from the back surface than the front surface.

16. A method as set forth in claim 11 further comprising the step of applying a rinsing fluid between the pads after polishing is substantially complete so that a resulting solution including the slurry and the rinsing fluid is alkaline.

17. A method as set forth in claim 11 further comprising the step of applying a rinsing fluid between the pads after polishing is substantially complete so that a resulting solution including the slurry and the rinsing fluid has a buffered pH between about 7.8 and about 11.8.

18. A method as set forth in claim 11 further comprising the operation of applying pressure to the first and second pads and thereby to the wafer, wherein the operation of providing a polishing apparatus includes providing the second pad having a significantly larger size than the wafer, the back surface of the water mounted to be translatable and rotatable relative to the second pad, wherein the rotating step includes rotating and moving the wafer such that substantially all of the back surface of the wafer is substantially continuously moving relative to the second pad so that deviations in the second pad do not substantially affect the flatness of the front surface and such that the front surface and back surface are maintained substantially parallel after final polishing.

19. A method as set forth in claim 18 wherein during the rotation step substantially all of the wafer remains between the first and second pads so that the wafer is evenly polished.

20. A method as set forth in claim 19 wherein the operation of providing a polishing apparatus includes providing a second pad which has grooves for receiving polishing slurry to inhibit unstable hydrodynamic lubrication between the second pad and the back surface.

21. A method as set forth in claim 20 wherein the operation of providing a polishing apparatus includes providing a first pad which is a finish-type polishing pad.

22. A method as set forth in claim 11 further comprising the step of selecting rotation speeds of the wafer carrier, the first pad and the second pad such that velocity of the back surface relative to the second pad is less than velocity of the front surface relative to the first pad to inhibit unstable hydrodynamic lubrication between the second pad and the back surface to inhibit vibration of the wafer.

23. A method as set forth in claim 22 wherein during the rotation step, the carrier orbits a center of the polishing apparatus, the speeds being selected such that a point on the water does not follow the same path about a center of the polishing apparatus before the wafer has completed at least about 25 percent of the total number of carrier rotations about the center of the polishing apparatus during the final polishing operation.

24. A method as set forth in claim 23 further comprising the step of selecting rotation speeds of the wafer carrier, the first pad and the second pad such that the wafer velocity of each point on the wafer surfaces relative to the first and second pads is never equal to zero during polishing.

25. A method as set forth in claim 23 wherein the second pad rotates in the same direction as the wafer carrier and the first pad rotates in the opposite direction of the second pad during polishing.

26. A method as set forth in claim 22 wherein rotation speeds are selected such that the velocity of the back surface relative to the second pad is less than about half of the velocity of the front surface relative to the first pad.

27. A method as set forth in claim 26 further comprising the steps of applying pressure to the first and second pads and thereby to the wafer when polishing is initiated, increasing the pressure after polishing is initiated to remove wafer material, thereafter decreasing the pressure to smooth the wafer, and thereafter further decreasing the pressure during rinsing.

28. A method as set forth in claim 27 wherein said step of further decreasing the pressure during rinsing comprises decreasing the pressure to a minimum pressure to maintain wafer stability during rinsing.

29. A method as set forth in claim 28 wherein said providing step includes providing a wafer carrier having a thickness less than a final thickness of the wafer after final polishing is complete to minimize pressure against the carrier and minimize carrier wear to thereby inhibit harmful particle formation and metallic contamination of the polishing slurry and so that pressure applied to the wafer by the pads remains constant during polishing.

30. A method as set forth in claim 28 wherein various pressures selected during final polishing are sufficiently low so that the final polishing operation causes substantially no crystal structure damage in the wafer.

31. A method as set forth in claim 30 wherein the pressure when polishing is initiated is no greater than 33 percent of a maximum pressure which is applied after initiation of polishing to remove wafer material.

32. A method as set forth in claim 11 further comprising a rinsing operation performed after final polishing of said front surface is substantially complete, rotation of at least one of the carrier, first pad and second pad continuing during rinsing, the rinsing operation including applying a rinsing fluid having a higher viscosity than the polishing slurry between said pads while continuing to apply polishing slurry between said pads to increase hydrodynamic lubrication between the first pad and the front surface of the wafer such that a distance between the first pad and the front surface is increased and so that the front surface of the wafer does not substantially contact the first pad during rinsing.

33. A method as set forth in claim 32 wherein said steps of applying the polishing slurry and applying the rinsing fluid occur at the same time at the onset of said rinsing operation, and wherein said step of applying the polishing slurry is terminated when the wafer is substantially stable relative to the first and second pads.

34. A method as set forth in claim 32 further comprising the step of selecting rotation speeds of the wafer carrier, the first pad and the second pad such that velocity of the back surface relative to the second pad is less than velocity of the front surface relative to the first pad to inhibit unstable hydrodynamic lubrication between the second pad and the back surface of the wafer such that a distance between the second pad and the second surface is not increased during rinsing and so that the wafer remains stable during rinsing.

35. A method as set forth in claim 34 further comprising the step of channeling the rinsing fluid in the second pad from between the back surface and the second pad to inhibit unstable hydrodynamic lubrication between the second pad and the back surface of the wafer.

36. A method as set forth in claim 32 wherein the rinsing operation includes selecting the rinsing fluid including polyethylene oxide for increasing hydrodynamic lubrication between the front surface of the wafer and the first pad.

37. A method as set forth in claim 32 wherein the rinsing operation includes selecting the rinsing fluid having a viscosity at least 2 times greater than the viscosity of the polishing slurry, wherein the rinsing fluid and polishing slurry have similar temperatures when viscosity is measured.

38. A method as set forth in claim 11 further comprising the step of applying a rinsing fluid to the pad after polishing is complete so that a solution including the slurry and the rinsing fluid has a buffered pH between about 8.8 and about 10.8.

39. A method as set forth in claim 38 wherein the rinsing operation includes selecting the rinsing fluid adapted to inhibit agglomeration of silica particles in the slurry and to protect the wafer against damage caused by highly caustic liquid remaining in the pad after rinsing.

40. A method as set forth in claim 38 further comprising the steps of stopping rotation of the carrier, first pad and second pad, removing the wafer from the polishing apparatus and spraying at least the front surface of the wafer with a protectant for inhibiting particle adhesion to the front surface.

41. A method as set forth in claim 38 further comprising the steps of stopping rotation of the carrier, first pad and second pad, removing the wafer from the polishing apparatus and spraying at least the front surface of the wafer with an aqueous solution including polyethylene oxide for inhibiting particle adhesion to the front surface.

42. A method as set forth in claim 41 further comprising the step of immersing the wafer in a bath after final polishing to remove particles from the wafer and to maintain a passive oxide layer on the front surface of the wafer while unloading wafers from the apparatus.

43. A method as set forth in claim 11 further comprising the steps of applying an alkaline solution to at least one of the pads to dissolve at least some of the polishing slurry and the water and thereby cause silicic acid and polysilicic acid to be deposited on at least one of the pads.

44. A method as set forth in claim 43 further comprising the step of selecting an alkaline solution having a pH of at least about 12 and the step of applying pressure to the wafer simultaneously with application of the alkaline solution.

45. A method of manufacturing a semiconductor wafer having a front surface and a back surface, the method comprising the operations of;

providing an ingot of semiconductor material;

slicing the wafer from the ingot;

processing the wafer to increase parallelism of the front surface and the back surface; and final polishing the front surface by:
  a) providing a polishing apparatus having a wafer carrier generally disposed between a first pad and a second pad, said second pad having surface area for contacting the back surface of the wafer at least about 10 percent larger than the back surface of the wafer so that the wafer can move laterally as well as rotate relative to the second pad,
  b) placing the wafer in the wafer carrier so that said front surface faces said first pad and so that said back surface faces said second pad, the wafer being free to move relative to the first and second pads,
  c) applying a solution including polishing slurry between said pads,
  d) selecting rotation speeds of the wafer carrier, the first pad and the second pad such that during rotation velocity of the back surface relative to the second pad is less than velocity of the front surface relative to the first pad to inhibit unstable hydrodynamic lubrication between the second pad and the back surface and inhibit vibration of the wafer, and
  e) rotating at least one of the wafer carrier, the first pad and the second pad such that the front and back surfaces of the wafer rotate and translate relative to the first and second pads to remove less than about 1.5 microns of wafer materials, to maintain parallelism of the front and back surfaces and to produce a finish polish on at least the front surface of the wafer so that after cleaning the front surface is prepared for integrated circuit fabrication.

46. A method as set forth in claim 45 further comprising the steps of applying pressure to the first and second pads and thereby to the wafer when polishing is initiated, increasing the pressure after polishing is initiated to remove wafer material, thereafter decreasing the pressure to smooth the wafer, and thereafter further decreasing the pressure during rinsing.

47. A method as set forth in claim 46 further comprising a rinsing operation performed after final polishing of said front surface is substantially complete, rotation of at least one of the carrier, first pad and second pad continuing during rinsing, the rinsing operation including applying a rinsing fluid having a higher viscosity than the polishing slurry between said pads while continuing to apply polishing slurry between said pads to increase hydrodynamic lubrication between the first pad and the front surface of the wafer such that distance between the first pad and the front surface increases and so that the front surface of the wafer does not contact the first pad during rinsing.

48. A method as set forth in claim 46 wherein during the rotation step substantially all of the wafer remains between the first and second pads so that the wafer is evenly polished, the carrier rotating about its own center and orbiting a center of the polishing apparatus during the rotation step, the rotation speeds of the carrier and pads being selected such that a point on the wafer does not follow the same path about the center of the polishing apparatus before the wafer has completed at least 10 percent of the total number of carrier rotations about the center during the operation of final polishing, and further comprising the step of selecting rotation speeds of the wafer carrier, the first pad and the second pad such that the water velocity of each point on the wafer surfaces relative to the first and second pads is never equal to substantially zero during polishing.

* * * * *

UNITED STATES PATENT AND TRADEMARK OFFICE
CERTIFICATE OF CORRECTION

PATENT NO. : 6,709,981 B2  
DATED : March 23, 2004  
INVENTOR(S) : Alexis Grabbe et al.

It is certified that error appears in the above-identified patent and that said Letters Patent is hereby corrected as shown below:

Column 20,
Line 48, "water does" should read -- wafer does --.

Column 23,
Line 2, "materials, to" should read -- material, to --.

Signed and Sealed this

Eighteenth Day of January, 2005

JON W. DUDAS
*Director of the United States Patent and Trademark Office*